(12) United States Patent
Nakata (10) Patent No.: US 11,777,419 B2
(45) Date of Patent: Oct. 3, 2023

(54) SEMICONDUCTOR DEVICE, SEMICONDUCTOR DEVICE MANUFACTURING METHOD, AND POWER CONVERTER

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/835,564

(22) Filed: Jun. 8, 2022

(65) Prior Publication Data

US 2023/0065822 A1 Mar. 2, 2023

(30) Foreign Application Priority Data

Sep. 1, 2021 (JP) .................. 2021-142277

(51) Int. Cl.
*H02M 7/00* (2006.01)
*H01L 23/29* (2006.01)
*H02M 3/00* (2006.01)
H01L 23/31 (2006.01)
H02M 7/217 (2006.01)
H02M 3/155 (2006.01)
H02M 7/5387 (2007.01)

(52) U.S. Cl.
CPC .......... *H02M 7/003* (2013.01); *H01L 23/291* (2013.01); *H01L 23/293* (2013.01); *H02M 3/003* (2021.05); *H01L 23/3142* (2013.01); *H02M 3/155* (2013.01); *H02M 7/217* (2013.01); *H02M 7/5387* (2013.01)

(58) Field of Classification Search
CPC ...... H02M 3/003; H02M 3/155; H02M 7/003; H02M 7/217; H02M 7/5387; H01L 23/291; H01L 23/293
See application file for complete search history.

(56) References Cited

U.S. PATENT DOCUMENTS 8,093,652 B2 * 1/2012 Bose Jayappa Veeramma ........... H01L 29/7395 257/329
9,831,145 B2 * 11/2017 Ishimaru ............... H01L 23/051
(Continued)

FOREIGN PATENT DOCUMENTS

JP 2019-175937 A 10/2019

*Primary Examiner* — Jue Zhang
(74) *Attorney, Agent, or Firm* — Studebaker & Brackett PC (57) ABSTRACT

A semiconductor device includes: a semiconductor substrate in which a cell region, an isolation region being a region which is located outward of the cell region, and a termination region including a guard ring region being located outward of the isolation region and an excess region being a region which is located outward of the guard ring region are defined; an insulating layer covering a top surface of the semiconductor substrate in the isolation region and the termination region; a surface electrode located on a portion of the top surface of the semiconductor substrate and a portion of a top surface of the insulating layer in the cell region and the isolation region; and a waterproof layer covering a portion of the insulating layer exposed from the surface electrode. The waterproof layer is spaced apart from the surface electrode.

8 Claims, 4 Drawing Sheets

(56) References Cited

U.S. PATENT DOCUMENTS

| | | | | |
|---|---|---|---|---|
| 2002/0100935 A1* | 8/2002 | Inoue | ............... | H01L 29/7395 |
| | | | | 257/E29.066 |
| 2010/0044825 A1* | 2/2010 | Schmidt | ............ | H01L 29/8611 |
| | | | | 257/493 |
| 2013/0187240 A1* | 7/2013 | Takano | ............. | H01L 29/7802 |
| | | | | 438/510 |
| 2019/0305140 A1 | 10/2019 | Morimoto | | |

* cited by examiner

SEMICONDUCTOR DEVICE, SEMICONDUCTOR DEVICE MANUFACTURING METHOD, AND POWER CONVERTER

BACKGROUND OF THE INVENTION

Field of the Invention

The present disclosure relates to semiconductor devices, semiconductor device manufacturing methods, and power converters.

Description of the Background Art

It has been found that moisture intrusion from a termination portion to the interior of a semiconductor element mounted to a semiconductor device reduces a breakdown voltage of the semiconductor device. As a structure to solve the problem, Japanese Patent Application Laid-Open No. 2019-175937 discloses a structure in which an insulating layer and a metal electrode (corresponding to a surface electrode) located in a termination region of a semiconductor substrate are covered with a silicon nitride film (corresponding to a waterproof layer) having a low moisture permeability to prevent corrosion of the metal electrode due to moisture, for example.

However, in a semiconductor device to which a semiconductor element is mounted in a pressure bonding step accompanied by depression of the semiconductor element, such as silver sinter bonding, the metal electrode is likely to be deformed when the semiconductor element is depressed. When the metal electrode is deformed, a thin portion of the silicon nitride film that rides on the metal electrode and cannot follow deformation is cracked, and the crack propagates to the insulating layer covering the termination region. This causes a problem in that moisture intrudes from the crack propagating to the insulating layer, and reduces a breakdown voltage of the semiconductor device.

SUMMARY

It is an object of the present disclosure to provide technology enabling suppression of cracking of a waterproof layer when a semiconductor element is mounted in a pressure bonding step and suppression of reduction in breakdown voltage of a semiconductor device.

A semiconductor device according to the present disclosure includes a semiconductor substrate, an insulating layer, a surface electrode, and a waterproof layer. A cell region, an isolation region, and a termination region are defined in the semiconductor substrate. The cell region is an active region where a current flows. The isolation region is a region which is located outward of the cell region and where generation of an electric field is limited when a breakdown voltage is held. The termination region includes a guard ring region located outward of the isolation region and an excess region that is a region which is located outward of the guard ring region and where development of a depletion layer is limited when the breakdown voltage is held. The insulating layer covers a top surface of the semiconductor substrate in the isolation region and the termination region. The surface electrode is located on a portion of the top surface of the semiconductor substrate and a portion of a top surface of the insulating layer in the cell region and the isolation region. The waterproof layer covers a portion of the insulating layer exposed from the surface electrode. The waterproof layer is spaced apart from the surface electrode.

The waterproof layer is spaced apart from the surface electrode, and has no portion riding on the surface electrode in which a crack of the waterproof layer starts, so that cracking of the waterproof layer when a semiconductor element is mounted in a pressure bonding step can be suppressed. Reduction in breakdown voltage of the semiconductor device can thereby be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below with reference to the accompanying drawings. Features described in embodiments below are examples, and all the features are not necessarily required. In description made below, similar components in a plurality of embodiments bear the same or similar reference signs, and a different component will mainly be described. In description made below, specific locations and directions defined by terms such as "upper", "lower", "left", "right", "front", and "back" may not necessarily match locations and directions in actual implementations.

Embodiment 1

Figure 1:
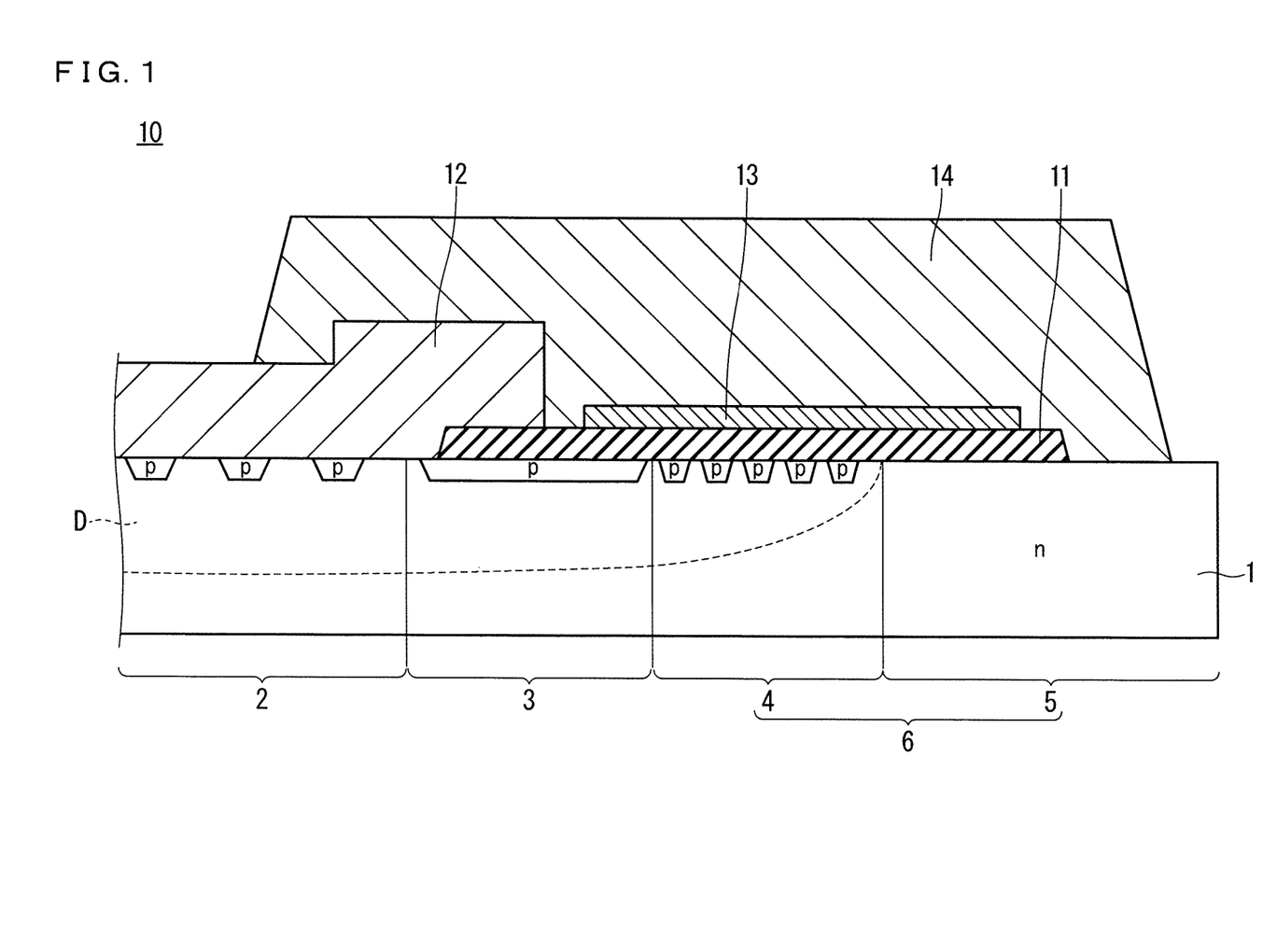
FIG. 1 is a cross-sectional view schematically showing a termination structure of a semiconductor element of a semiconductor device according to Embodiment 1.
Figure 2:
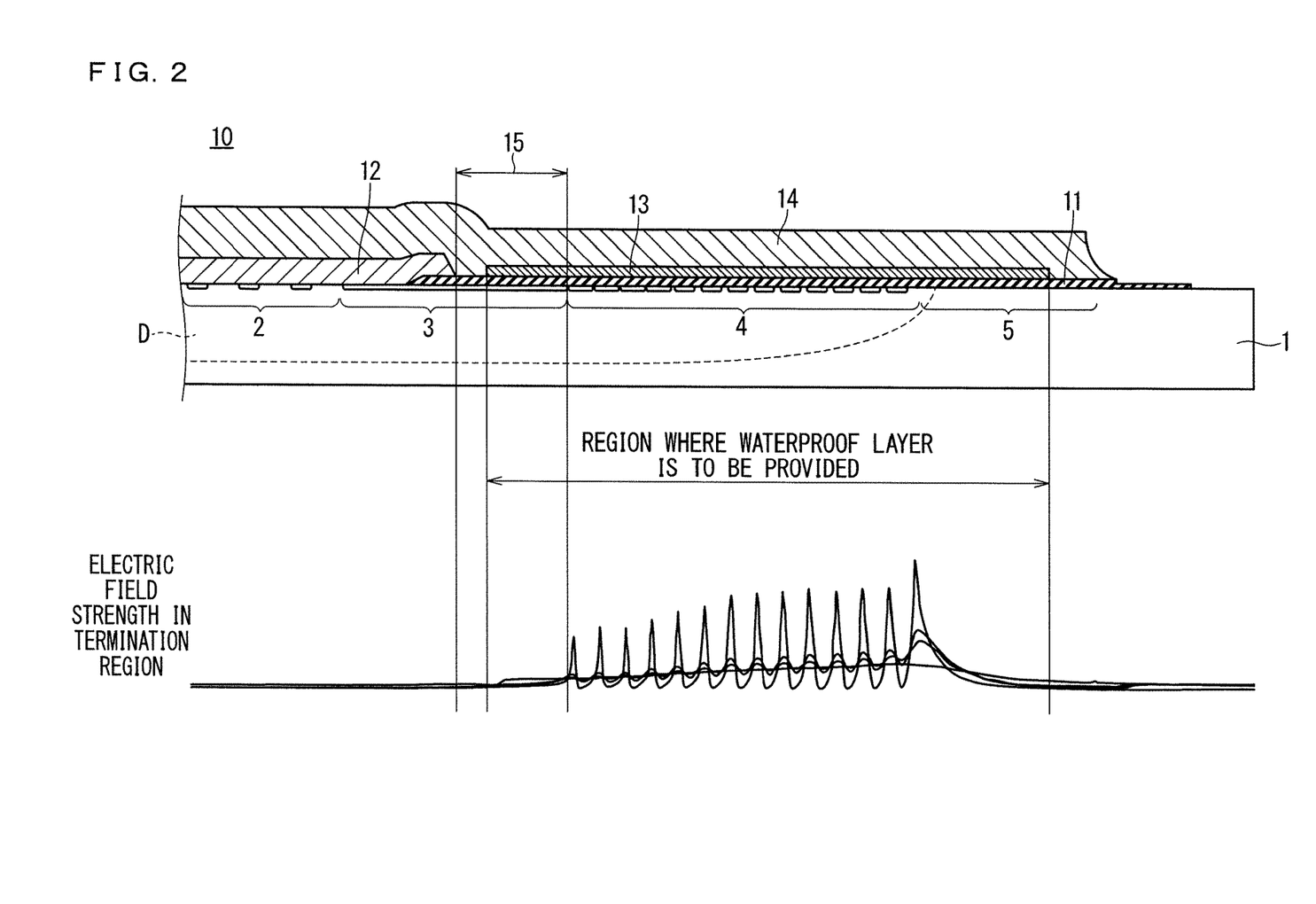
FIG. 2 shows an example of a simulation result of electric field distribution relating to the termination structure of the semiconductor element of the semiconductor device according to Embodiment 1.

Embodiment 1 will be described below with reference to the drawings. FIG. 1 is a cross-sectional view schematically showing a termination structure of a semiconductor element 10 of a semiconductor device 50 (see FIG. 3E) according to Embodiment 1. FIG. 2 shows an example of a simulation result of electric field distribution relating to the termination structure of the semiconductor element 10 of the semiconductor device 50 (see FIG. 3E) according to Embodiment 1.

As shown in FIG. 1, the semiconductor element 10 of the semiconductor device 50 (see FIG. 3E) includes a semiconductor substrate 1, an insulating layer 11, a surface electrode 12, a waterproof layer 13, and a protective film 14.

The semiconductor substrate 1 is an n-type semiconductor substrate, and a cell region 2, an isolation region 3, and a termination region 6 are defined in the semiconductor substrate 1. The cell region 2 is an active region where a current flows, and p-type semiconductor portions are located in the cell region 2. The isolation region 3 is a region which is located outward of and adjacent to the cell region 2 to cover the cell region 2 and where generation of an electric field is limited when a breakdown voltage is held. A p-type semiconductor portion is located in the isolation region 3.

The termination region 6 includes a guard ring region 4 and an excess region 5. The guard ring region 4 is located outward of and adjacent to the isolation region 3 to cover the isolation region 3, and a plurality of discrete p-type semiconductor portions are located in the guard ring region 4.

The excess region 5 is located outward of and adjacent to the guard ring region 4 to cover the guard ring region 4. The excess region 5 is a region which includes an n-type semiconductor and where development of a depletion layer is limited when the breakdown voltage is held.

At least one of a semiconductor switching element with an unillustrated built-in diode and a diode is disposed in the cell region 2, for example. Description will be made below by taking, as an example, a configuration in which the semiconductor switching element with the built-in diode is disposed in the cell region 2. With such a configuration, the cell region 2 passes therethrough a current when the semiconductor switching element is in an on state, and the isolation region 3 and the termination region 6 hold the breakdown voltage when the semiconductor switching element is in an off state.

The semiconductor substrate 1 includes an n-type semiconductor containing silicon carbide as a major component. The p-type semiconductor portions can be formed by implanting and diffusing aluminum ions into a semiconductor containing silicon carbide as a major component, for example.

The insulating layer 11 is located to cover a top surface of the semiconductor substrate 1 in the isolation region 3 and the termination region 6. Specifically, the insulating layer 11 is located on the top surface of the semiconductor substrate 1 in a region except for edges of the isolation region 3 and the termination region 6 in top view.

The surface electrode 12 is located on a portion of the top surface of the semiconductor substrate 1 and a portion of a top surface of the insulating layer 11 in the cell region 2 and the isolation region 3. Specifically, the surface electrode 12 is located on the portion of the top surface of the semiconductor substrate 1 in the cell region 2 and the isolation region 3 and on the portion of the top surface of the insulating layer 11 in the isolation region 3. The surface electrode 12 is located to span the portion of the top surface of the semiconductor substrate 1 to the portion of the top surface of the insulating layer 11.

The waterproof layer 13 is located on a top surface of a portion of the insulating layer 11 exposed from the surface electrode 12 to cover the portion of the insulating layer 11 exposed from the surface electrode 12. The waterproof layer 13 is spaced apart from the surface electrode 12 not to ride on the surface electrode 12. That is to say, the waterproof layer 13 is formed only on a top surface of a portion of the insulating layer 11 rarely deformed when the semiconductor element 10 is depressed in a pressure bonding step.

The protective film 14 is located over the top surface of the semiconductor substrate 1 in a portion of the cell region 2, the isolation region 3, and the termination region 6 to cover a portion of the surface electrode 12, the waterproof layer 13, and the insulating layer 11.

A depletion layer D develops outward from the cell region 2 when a voltage is applied to the semiconductor element 10 as shown in FIG. 2, and, in this case, an electric field is not generated in the isolation region 3, but is generated in the guard ring region 4 where the plurality of discrete p-type semiconductors are located. In the excess region 5 located outward of the guard ring region 4, the electric field is generated to a location to which the depletion layer D develops. The excess region 5 basically extends beyond a location to which the depletion layer D is assumed to develop at a breakdown voltage in actual use. That is to say, the electric field is not generated in the middle of the excess region 5.

Thus, suppression of moisture intrusion at least into a region where the depletion layer D develops in the guard ring region 4 and the excess region 5 allows the semiconductor element 10 to produce a sufficient effect. The semiconductor element 10 can thus produce the sufficient effect even when the waterproof layer 13 is spaced apart from the surface electrode 12, so that reliability of the semiconductor element 10 can be secured.

The insulating layer 11 includes a silicon oxide film as a major component, for example, and the protective film 14 includes polyimide or polyamide as a major component, for example. The waterproof layer 13 includes a silicon nitride film as a major component, for example. A method of providing some conductivity to the silicon nitride film to level out electric field distribution in the guard ring region 4 is sometimes used, but the silicon nitride film for waterproofing in the present embodiment preferably does not have conductivity.

A waterproofing function of the waterproof layer 13 can further be improved by forming the waterproof layer 13 in at least two layers, for example. This is because, if any pinholes are formed in the first formation, the pinholes are filled in the second and subsequent formations.

As shown in FIG. 1, one end of the waterproof layer 13 opposes a portion of the isolation region 3 of the semiconductor substrate 1 spaced apart from the surface electrode 12, and the other end of the waterproof layer 13 opposes the excess region 5 of the semiconductor substrate 1. As described above, the waterproof layer 13 covers a portion of the insulating layer 11 opposing a region including an end in a direction of development of the depletion layer D, so that moisture intrusion into a high electric field portion can be suppressed to improve a lifetime in a temperature humidity bias (THB) test. The direction of development of the depletion layer D is herein a rightward direction in FIG. 1. The one end of the waterproof layer 13 can be spaced apart from the surface electrode 12 within a range shown by a double-headed arrow 15 in FIG. 2.

The waterproof layer 13 is located inward of an edge of the insulating layer 11 in top view. In a case where the waterproof layer 13 protrudes from the edge of the insulating layer 11 in top view, the waterproof layer 13 rides on a step at the edge of the insulating layer 11 to have a locally thin portion. While a crack starts in the thin portion of the waterproof layer 13 when the semiconductor element 10 is mounted in the pressure bonding step, the waterproof layer 13 is located inward of the edge of the insulating layer 11 in top view, and thus does not have the thin portion, so that the crack starting in the portion of the waterproof layer 13 when pressure bonding is performed can be avoided.

Steps of manufacturing the semiconductor device 50 will be described next with reference FIGS. 3A to 3E. FIGS. 3A to 3E are cross-sectional views schematically showing the steps of manufacturing the semiconductor device 50 according to Embodiment 1.

Figure 3A:
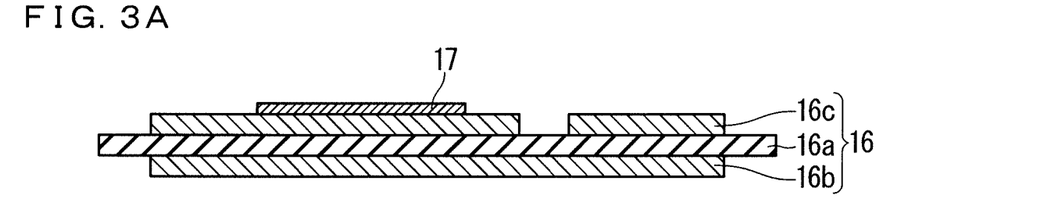
FIGS. 3A to 3E are cross-sectional views schematically showing steps of manufacturing the semiconductor device according to Embodiment 1.

Considered is a case where the semiconductor element 10 is bonded by sinter bonding to enhance reliability when the semiconductor element 10 is operated at a high temperature. First, as shown in FIG. 3A, an insulating substrate 16 including an insulating layer 16a and a circuit pattern 16b and a circuit pattern 16c provided respectively on a back surface and a front surface of the insulating layer 16a is prepared, and a bonding material 17 is disposed on a top surface of the circuit pattern 16c. As the bonding material 17, a bonding material containing silver or copper as a major component is used, for example.

Figure 3B:
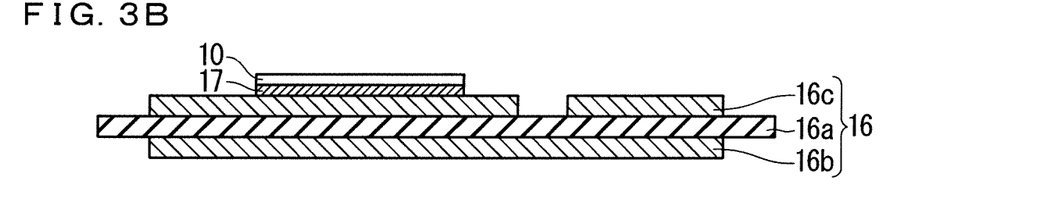

Next, as shown in FIG. 3B, the semiconductor element 10 is mounted over the insulating substrate 16 via the bonding material 17, and sinter bonding is performed in the subsequent pressure bonding step under pressure in a high temperature environment.

Figure 3C:
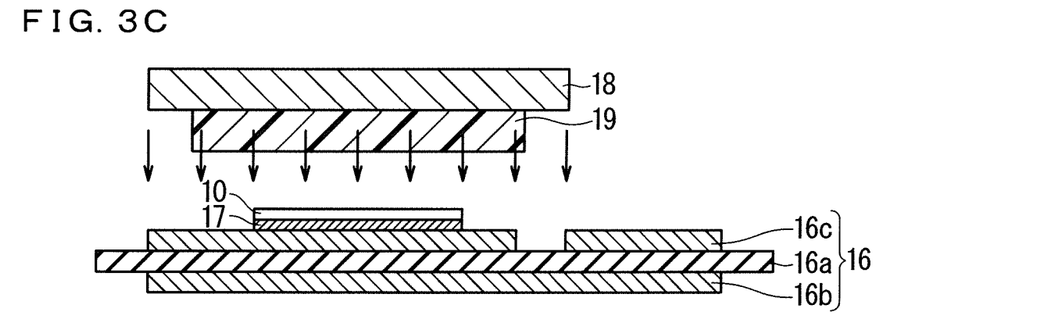

As shown in FIG. 3C, a buffer material 19, such as a Teflon® sheet, is disposed between a pressure jig 18 and the semiconductor element 10 to prevent damage of the semiconductor element 10 in the pressure bonding step.

Figure 3D:
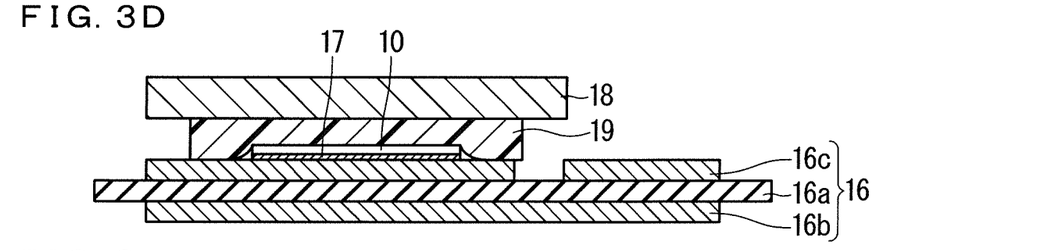
Figure 3E:
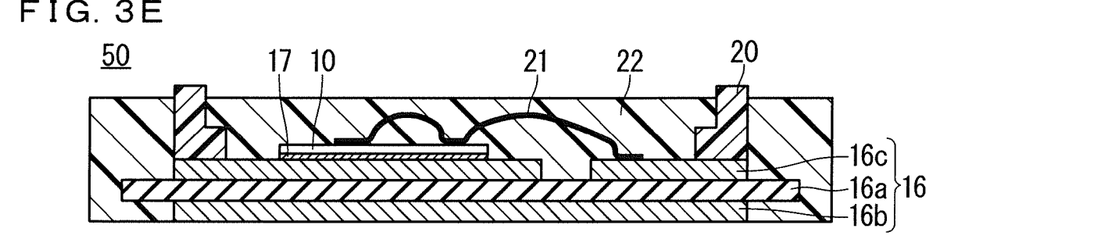

After the insulating substrate 16 and the semiconductor element 10 are electrically and thermally connected by sinter bonding in the pressure bonding step as shown in FIG. 3D, a wire bond 21 is connected to an unillustrated electrode on the surface of the semiconductor element 10 as shown in FIG. 3E to allow a high current to flow.

A case 20 with which an unillustrated terminal to provide external electrical connection is integrally formed is bonded to the circuit pattern 16c. The case 20 is filled with a sealing material 22, such as a gel, to cover the semiconductor element 10 with the sealing material 22, so that the semiconductor device 50 having a high stainproofing property is completed.

A problem arising in a case where the waterproof layer 13 rides on the surface electrode 12 and an effect produced by the semiconductor device 50 according to Embodiment 1 will be described next.

When application of a high bias voltage to the semiconductor device 50 under a high humidity condition is maintained, moisture can permeate the sealing material 22, and reach the surface of the semiconductor element 10 from an external environment in the guard ring region 4 where an electric field is generated.

Compared with a semiconductor element containing silicon as a major component, the semiconductor element 10 containing silicon carbide as a major component typically has a smaller width of the guard ring region 4 and a high peak of an electric field generated on the insulating layer 11. Thus, in the guard ring region 4, moisture is likely to move, and the p-type semiconductor portions are likely to be deteriorated when moisture permeates. When moisture having reached a portion of the insulating layer 11 opposing the guard ring region 4 permeates the insulating layer 11, the p-type semiconductor portions in the guard ring region 4 are deteriorated, and the breakdown voltage of the semiconductor device 50 is reduced.

One method to solve the problem is a method of protecting the insulating layer 11 with the waterproof layer 13 including the silicon nitride film that moisture is less likely to permeate than the silicon oxide film as a major component. In a case where the semiconductor element 10 is mounted by depression of the surface of the semiconductor element 10 in the pressure bonding step, however, the waterproof layer 13 riding on a material likely to be deformed by pressure, such as the surface electrode 12, cracks, and the crack propagates to the insulating layer 11 covering the termination region 6. This causes a problem in that moisture intrudes from the crack propagating to the insulating layer 11, and reduces the breakdown voltage of the semiconductor device 50.

To address the problem, the semiconductor device 50 according to Embodiment 1 includes: the semiconductor substrate 1 in which the cell region 2 being an active region where a current flows, the isolation region 3 being a region which is located outward of the cell region 2 and where generation of an electric field is limited when the breakdown voltage is held, and the termination region 6 including the guard ring region 4 being located outward of the isolation region 3 and the excess region 5 being a region which is located outward of the guard ring region 4 and where development of the depletion layer D is limited when the breakdown voltage is held are defined; the insulating layer 11 covering the top surface of the semiconductor substrate 1 in the isolation region 3 and the termination region 6; the surface electrode 12 located on the portion of the top surface of the semiconductor substrate 1 and the portion of the top surface of the insulating layer 11 in the cell region 2 and the isolation region 3; and the waterproof layer 13 covering the portion of the insulating layer 11 exposed from the surface electrode 12, wherein the waterproof layer 13 is spaced apart from the surface electrode 12.

The waterproof layer 13 is spaced apart from the surface electrode 12, and has no portion riding on the surface electrode 12 in which a crack of the waterproof layer 13 starts, so that cracking of the waterproof layer 13 when the semiconductor element 10 is mounted in the pressure bonding step can be suppressed. Reduction in breakdown voltage of the semiconductor device 50 can thereby be suppressed. Durability of the semiconductor device 50 can thereby be improved.

The waterproof layer 13 is located inward of the edge of the insulating layer 11 in top view. The waterproof layer 13 thus does not have the thin portion, so that the crack starting in the portion of the waterproof layer 13 when pressure bonding is performed can be avoided. Cracking of the waterproof layer 13 starting at the step of the insulating layer 11 can thereby be suppressed.

The semiconductor element 10 further includes the protective film 14 covering the top surface of the semiconductor substrate 1 in the cell region 2, the isolation region 3, and the termination region 6, wherein the protective film 14 covers the surface electrode 12, the waterproof layer 13, and the insulating layer 11. Breakage of the waterproof layer 13 and the insulating layer 11 in the pressure bonding step can thereby be suppressed.

The waterproof layer 13 includes the silicon nitride film, so that the waterproofing function of the waterproof layer 13 can further be improved.

The protective film 14 includes polyimide or polyamide, and is thus more likely to be deformed in the pressure bonding step than the waterproof layer 13 and the insulating layer 11, and stress caused by depression of the semiconductor element 10 can be absorbed by deformation of the protective film 14. Cracking of the waterproof layer 13 and the insulating layer 11 can thereby be suppressed.

The waterproof layer 13 is formed in at least two layers, so that, if any pinholes are formed in the first formation, the pinholes are filled in the second and subsequent formations, and thus the waterproofing function of the waterproof layer 13 can further be improved.

Embodiment 2

In the present embodiment, the semiconductor device 50 according to Embodiment 1 described above is applied to a power converter. The semiconductor device 50 according to Embodiment 1 is not applied only to a particular power converter, but a case where the semiconductor device 50 according to Embodiment 1 is applied to a three-phase inverter will be described below in Embodiment 2.

Figure 4:
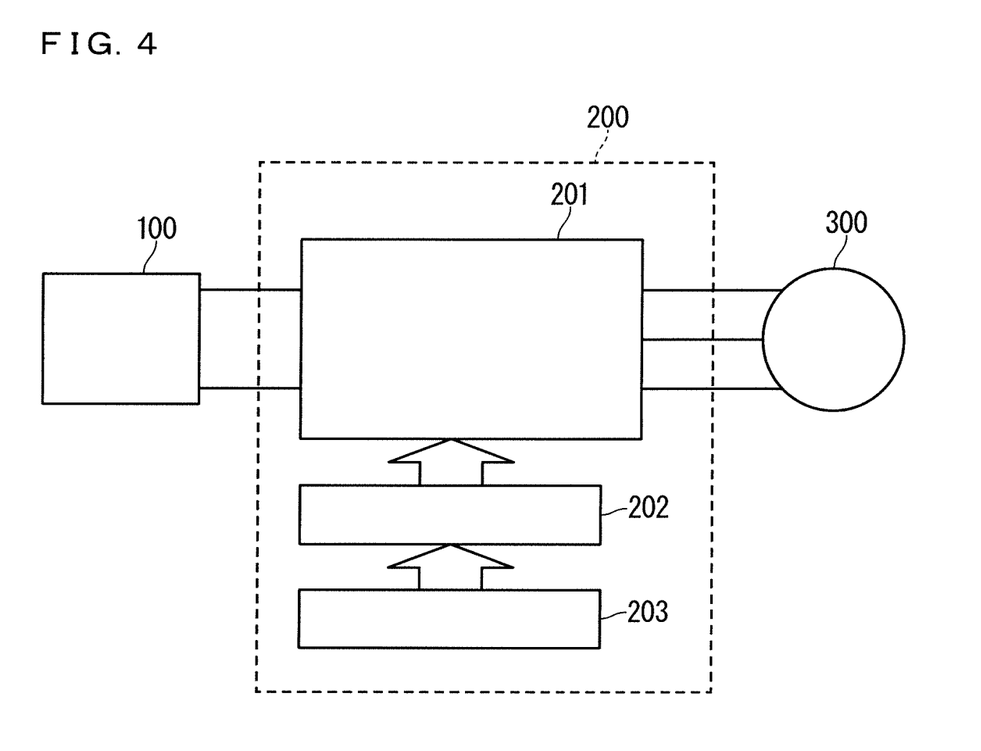
FIG. 4 is a block diagram showing a configuration of a power conversion system to which a power converter according to Embodiment 2 has been applied.

FIG. 4 is a block diagram showing a configuration of a power conversion system to which a power converter 200 according to Embodiment 2 has been applied.

The power conversion system shown in FIG. 4 includes a power supply 100, the power converter 200, and a load 300. The power supply 100 is a DC power supply, and supplies DC power to the power converter 200. The power supply 100 can be configured in various forms, and, for example, can be configured by a DC system, a solar cell, or a storage battery, and may be configured by a rectifier circuit or an AC/DC converter connected to an AC system. The power supply 100 may be configured by a DC/DC converter to convert DC power output from the DC system into predetermined power.

The power converter 200 is a three-phase inverter connected between the power supply 100 and the load 300, and converts the DC power supplied from the power supply 100 into AC power, and supplies the AC power to the load 300. As shown in FIG. 4, the power converter 200 includes a main conversion circuit 201 to convert the DC power into the AC power for output, a drive circuit 202 to output a drive signal to drive each of switching elements of the main conversion circuit 201, and a control circuit 203 to output, to the drive circuit 202, a control signal to control the drive circuit 202.

The load 300 is a three-phase motor driven by the AC power supplied from the power converter 200. The load 300 is not limited to that for a particular application, is a motor mounted to various types of electrical equipment, and is used as a motor for hybrid vehicles, electric vehicles, railroad vehicles, elevators, or air-conditioning equipment, for example.

The power converter 200 will be described in details below. The main conversion circuit 201 includes the switching elements and freewheeling diodes (not illustrated), and converts the DC power supplied from the power supply 100 into the AC power, and supplies the AC power to the load 300 through switching of the switching elements. The main conversion circuit 201 can have various specific circuit configurations, and the main conversion circuit 201 according to the present embodiment is a two-level three-phase full-bridge circuit, and can include six switching elements and six freewheeling diodes connected in anti-parallel with the respective switching elements. The semiconductor device 50 according to Embodiment 1 described above is applied to each of the switching elements of the main conversion circuit 201. Every two switching elements out of the six switching elements are connected in series with each other to constitute pairs of upper and lower arms, and the pairs of upper and lower arms constitute respective phases (a U phase, a V phase, and a W phase) of the full-bridge circuit. Output terminals of the respective pairs of upper and lower arms, that is, three output terminals of the main conversion circuit 201 are connected to the load 300.

The drive circuit 202 generates the drive signal to drive each of the switching elements of the main conversion circuit 201, and supplies the drive signal to a control electrode of each of the switching elements of the main conversion circuit 201. Specifically, the drive circuit 202 outputs, to the control electrode of each of the switching elements, a drive signal to switch the switching element to an on state and a drive signal to switch the switching element to an off state in accordance with the control signal from the control circuit 203, which will be described below. The drive signal is a voltage signal (an on signal) equal to or greater than a threshold voltage of the switching element when the switching element is maintained in the on state, and is a voltage signal (an off signal) equal to or smaller than the threshold voltage of the switching element when the switching element is maintained in the off state.

The control circuit 203 controls the switching elements of the main conversion circuit 201 so that desired power is supplied to the load 300. Specifically, time (on time) during which each of the switching elements of the main conversion circuit 201 is to be in the on state is calculated based on power to be supplied to the load 300. For example, the main conversion circuit 201 can be controlled through PWM control to modulate the on time of each of the switching elements in accordance with a voltage to be output. A control command (the control signal) is output to the drive circuit 202 so that the on signal is output to a switching element to be in the on state, and the off signal is output to a switching element to be in the off state at each time point. The drive circuit 202 outputs, as the drive signal, the on signal or the off signal to the control electrode of each of the switching elements in accordance with the control signal.

In the power converter 200 according to the present embodiment, the semiconductor device 50 according to Embodiment 1 is applied as each of the switching elements of the main conversion circuit 201, and thus cracking of the waterproof layer 13 having a low moisture permeability can be suppressed, and reduction in breakdown voltage of the semiconductor device 50 can be suppressed even in a case where the semiconductor element 10 is mounted in the pressure bonding step. Reduction in reliability of the power converter 200 can thereby be suppressed.

An example in which the semiconductor device 50 according to Embodiment 1 is applied to the two-level three-phase inverter has been described in the present embodiment, but application of the semiconductor device 50 according to Embodiment 1 is not limited to this example, and the semiconductor device 50 according to Embodiment 1 is applicable to various power converters. Although the power converter in the present embodiment is a two-level power converter, the power converter may be a three-level or multi-level power converter, and the semiconductor device 50 according to Embodiment 1 may be applied to a single-phase inverter when power is supplied to a single-phase load. The semiconductor device 50 according to Embodiment 1 is applicable to a DC/DC converter or an AC/DC converter when power is supplied to a DC load and the like.

The power converter to which the semiconductor device 50 according to Embodiment 1 has been applied is not limited to that in the above-mentioned case where the load is the motor, and can be used as a power supply device of an electrical discharge machine, a laser machine, an induction cooker, or a noncontact power supply system, for example, and can further be used as a power conditioner of a photovoltaic system, a storage system, and the like.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a semiconductor substrate in which a cell region, an isolation region, and a termination region are defined, the cell region being an active region where a current flows, the isolation region being a region which is located outward of the cell region and where generation of an electric field is limited when a breakdown voltage is held, the termination region including a guard ring region and an excess region, the guard ring region being located outward of the isolation region, the excess region being a region which is located outward of the guard ring region and where development of a depletion layer is limited when the breakdown voltage is held;
an insulating layer covering a top surface of the semiconductor substrate in the isolation region and the termination region;
a surface electrode located on a portion of the top surface of the semiconductor substrate and a portion of a top surface of the insulating layer in the cell region and the isolation region; and
a waterproof layer covering a portion of the insulating layer exposed from the surface electrode, wherein
the waterproof layer is spaced apart from the surface electrode.

2. The semiconductor device according to claim 1, wherein
the waterproof layer is located inward of an edge of the insulating layer in top view.

3. The semiconductor device according to claim 1, further comprising a protective film covering the top surface of the semiconductor substrate in the cell region, the isolation region, and the termination region, wherein
the protective film covers the surface electrode, the waterproof layer, and the insulating layer.

4. The semiconductor device according to claim 3, wherein
the protective film includes polyimide or polyamide.

5. The semiconductor device according to claim 1, wherein
the waterproof layer includes a silicon nitride film.

6. The semiconductor device according to claim 1, wherein
the semiconductor substrate includes silicon carbide.

7. A semiconductor device manufacturing method of manufacturing the semiconductor device according to claim 1, wherein
the waterproof layer is formed in at least two layers.

8. A power converter comprising:
a main conversion circuit to convert input power for output, the main conversion circuit including the semiconductor device according to claim 1;
a drive circuit to output, to the semiconductor device, a drive signal to drive the semiconductor device; and
a control circuit to output, to the drive circuit, a control signal to control the drive circuit.

* * * * *